(12) United States Patent
Yu et al.

(10) Patent No.: US 11,942,522 B2
(45) Date of Patent: Mar. 26, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Yexiao Yu, Hefei (CN); Zhongming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 331 days.

(21) Appl. No.: 17/468,920

(22) Filed: Sep. 8, 2021

(65) Prior Publication Data

US 2022/0320298 A1  Oct. 6, 2022

Related U.S. Application Data

(63) Continuation of application No. PCT/CN2021/104782, filed on Jul. 6, 2021.

(30) Foreign Application Priority Data

Mar. 31, 2021  (CN) .......................... 202110348268.4

(51) Int. Cl.
*H01L 21/28* (2006.01)
*H01L 21/033* (2006.01)
(Continued)

(52) U.S. Cl.
CPC ...... *H01L 29/4011* (2019.08); *H01L 21/0337* (2013.01); *H01L 21/3081* (2013.01); *H10B 12/482* (2023.02)

(58) Field of Classification Search
CPC ............. H01L 29/4011; H01L 21/0337; H01L 21/3081; H01L 21/0274; H10B 12/482; H10B 12/053; H10B 12/34
(Continued)

(56) References Cited

U.S. PATENT DOCUMENTS 9,159,730 B2   10/2015  Kim et al.
9,478,548 B2   10/2016  Lee et al.
(Continued)

FOREIGN PATENT DOCUMENTS

CN   103377905 A   10/2013
CN   109003938 A   12/2018
(Continued)

OTHER PUBLICATIONS

First Office Action of the Chinese application No. 202110348268.4, dated Dec. 3, 2021, 14 pgs.

*Primary Examiner* — Caleen O Sullivan
(74) *Attorney, Agent, or Firm* — Cooper Legal Group, LLC

(57) ABSTRACT

A method for manufacturing a semiconductor structure and the semiconductor structure are provided. The method includes the following operations. A substrate provided with a plurality of active areas arranged at intervals is provided. A first laminated structure and a first photoresist layer are sequentially formed on the substrate. Negative Type Develop (NTD) is performed on the first photoresist layer, to form a first pattern. The first laminated structure is etched along the first pattern, to form a second pattern in the first laminated structure. The substrate is etched up to a preset depth by taking the first laminated structure having the second pattern as a mask, to form a recess and form a plurality of protuberances arranged at intervals on the reserved substrate. The recess surrounds the protuberance, and the active area is exposed between the protuberances.

16 Claims, 33 Drawing Sheets

(51) Int. Cl.
*H01L 21/308* (2006.01)
*H10B 12/00* (2023.01)

(58) Field of Classification Search
USPC .......................................................... 438/362
See application file for complete search history.

(56) References Cited

U.S. PATENT DOCUMENTS

2014/0154882 A1   6/2014  Kim et al.
2016/0035731 A1   2/2016  Lee et al.
2020/0185648 A1*  6/2020  Choi ................... H10K 50/844

FOREIGN PATENT DOCUMENTS

CN      106252388 B    7/2019
CN      112530946 A    3/2021

* cited by examiner

US 11,942,522 B2

1

METHOD FOR MANUFACTURING SEMICONDUCTOR STRUCTURE AND SEMICONDUCTOR STRUCTURE

CROSS-REFERENCE TO RELATED APPLICATION

This is a continuation application of International Patent Application No. PCT/CN2021/104782, filed on Jul. 6, 2021, which claims priority to Chinese Patent Application No. 202110348268.4, filed on Mar. 31, 2021. The disclosures of International Patent Application No. PCT/CN2021/104782 and Chinese Patent Application No. 202110348268.4 are hereby incorporated by reference in their entireties.

BACKGROUND

A Dynamic Random Access Memory (DRAM) is a semiconductor structure commonly used in electronic devices such as computers, and is composed of multiple storage units. Each of the storage units may usually include a transistor and a capacitor. A gate of the transistor is electrically connected with a word line, a source of the transistor is electrically connected with a bit line, and a drain of the transistor is electrically connected with the capacitor. A word line voltage of the word line may control on/off states of the transistor, to further read data information stored in the capacitor through the bit line or write the data information into the capacitor.

However, with the size shrinks, an existing bit line structure is subject to single-point bridging in a manufacturing process, which results in shorting-circuiting between a bit line contact and a bit line contact, and thus influences performance of the device. In addition, a contact hole pattern of a circular bit line occupies a large bit line space, and it is easy to damage a side wall of an adjacent bit line contact in a process of etching a bit line, which results in that a structure of the bit line is unstable.

SUMMARY

The disclosure relates to the technical field of semiconductor manufacturing, and in particular relates to a method for manufacturing a semiconductor structure and the semiconductor structure.

The method includes operations as follows. A substrate is provided, and multiple active areas are arranged at intervals in the substrate. A first laminated structure and a first photoresist layer are sequentially formed on the substrate. Negative type develop is performed on the first photoresist layer by taking a first mask plate as a mask, to form a first pattern. The first laminated structure is etched along the first pattern, to form a second pattern in the first laminated structure. The substrate is etched up to a preset depth by taking the first laminated structure having the second pattern as a mask, to form a recess, and form multiple protuberances arranged at intervals on the reserved substrate. The recess surrounds the protuberance, and the active area is exposed between the protuberances.

The embodiments of the disclosure further provide a semiconductor structure, which includes a bit line formed according to the above method for manufacturing the semiconductor structure.

2

Figure 1:
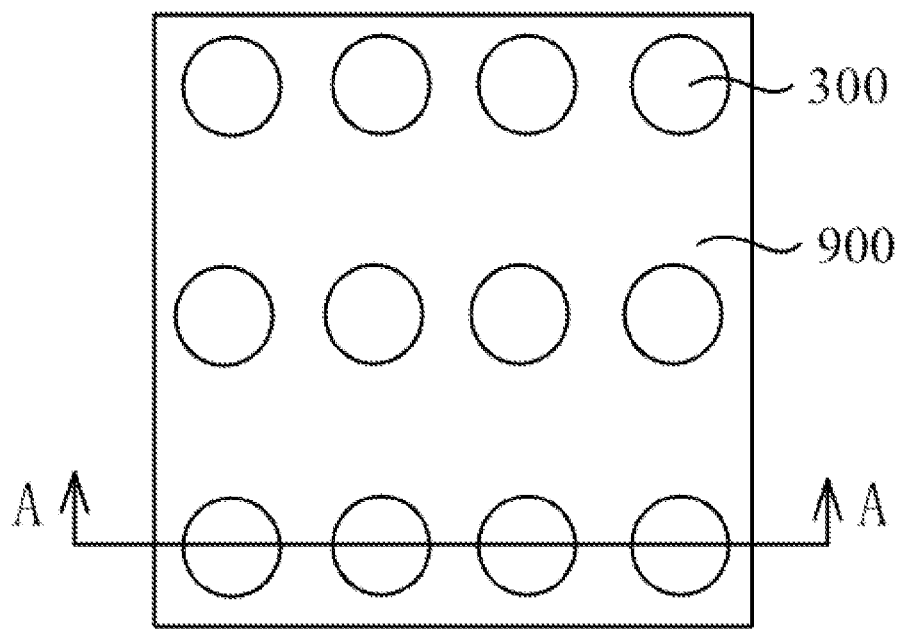
FIG. 1 is a top view after a first photoresist layer is formed in a related technology.
Figure 2:
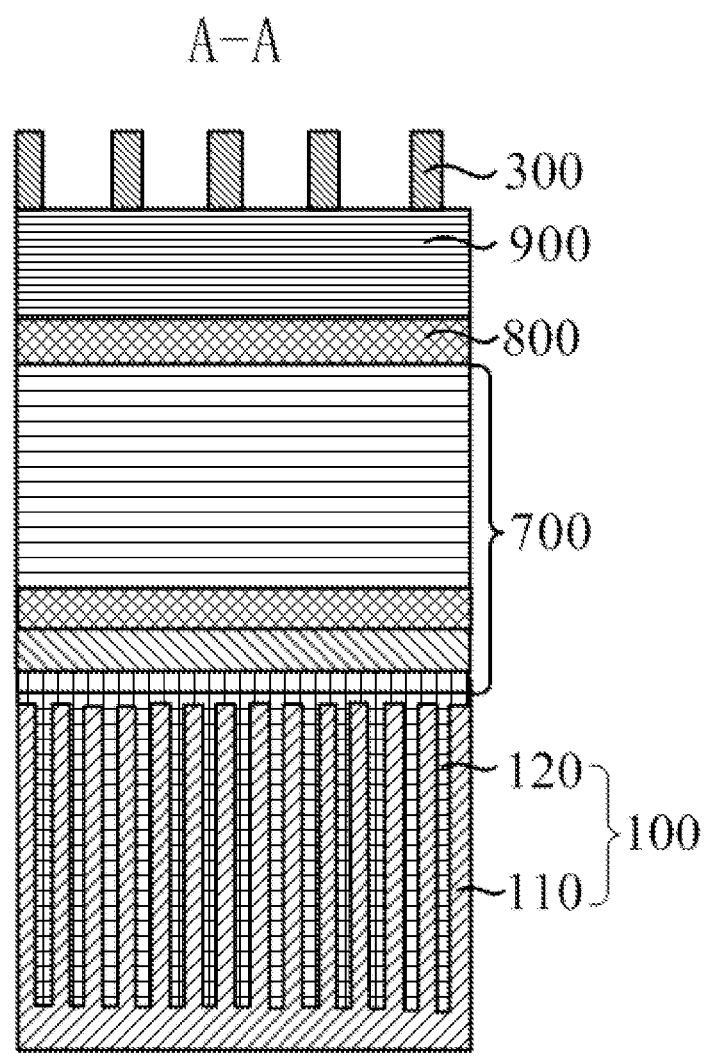
Figure 3:
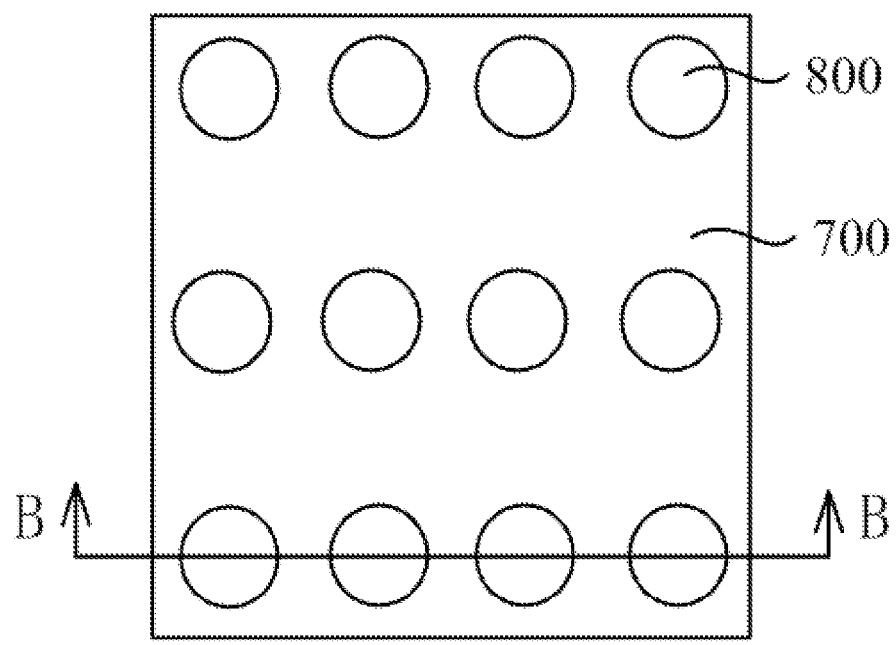
Figure 4:
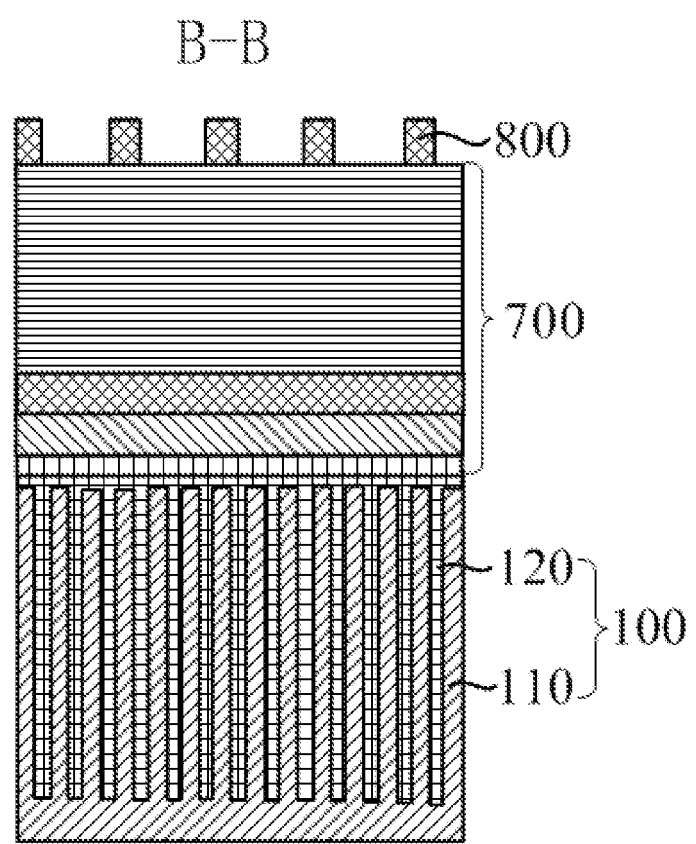
Figure 5:
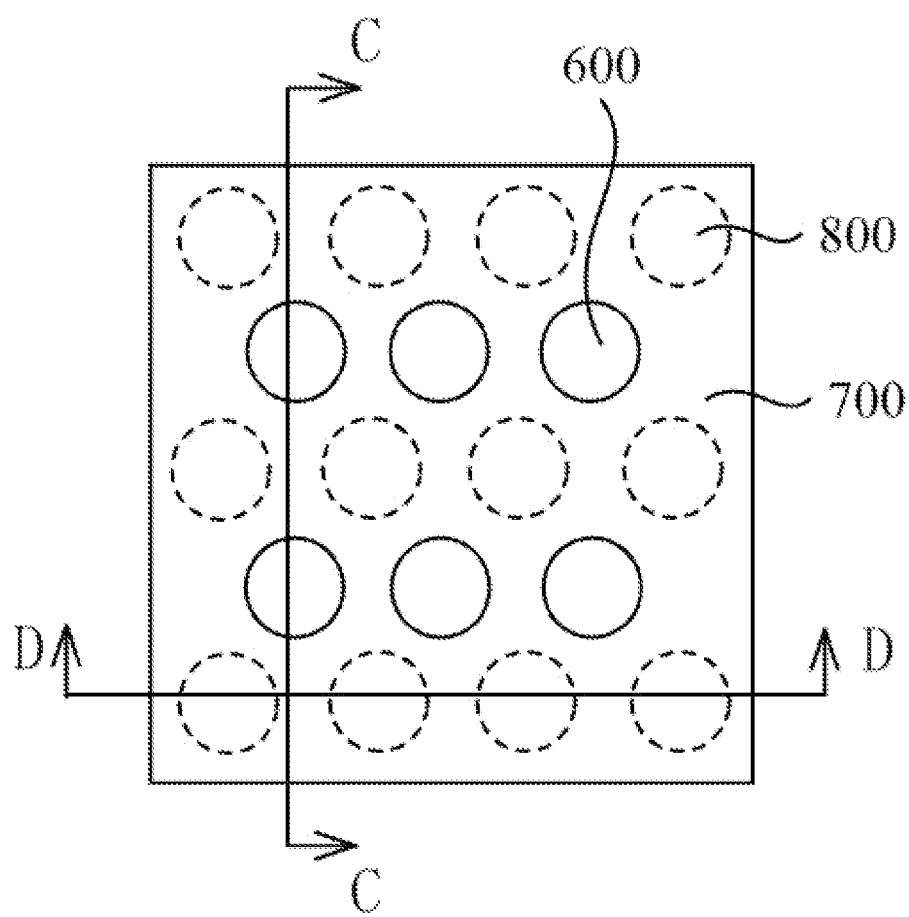
Figure 6:
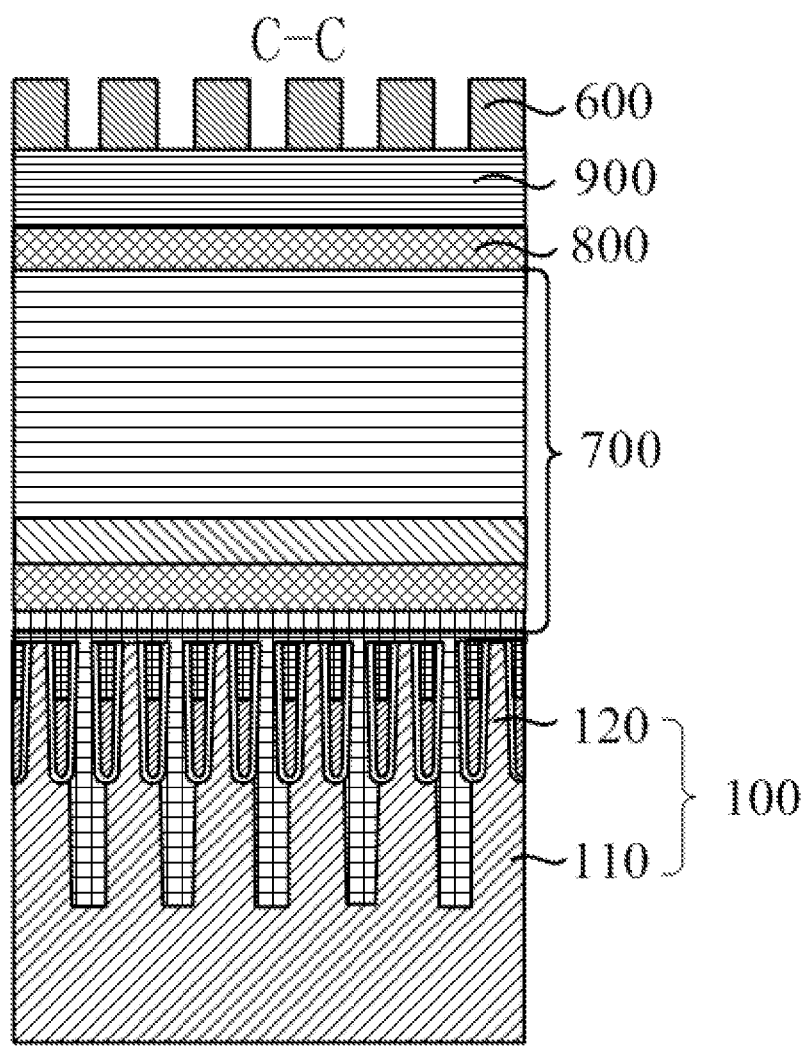
Figure 7:
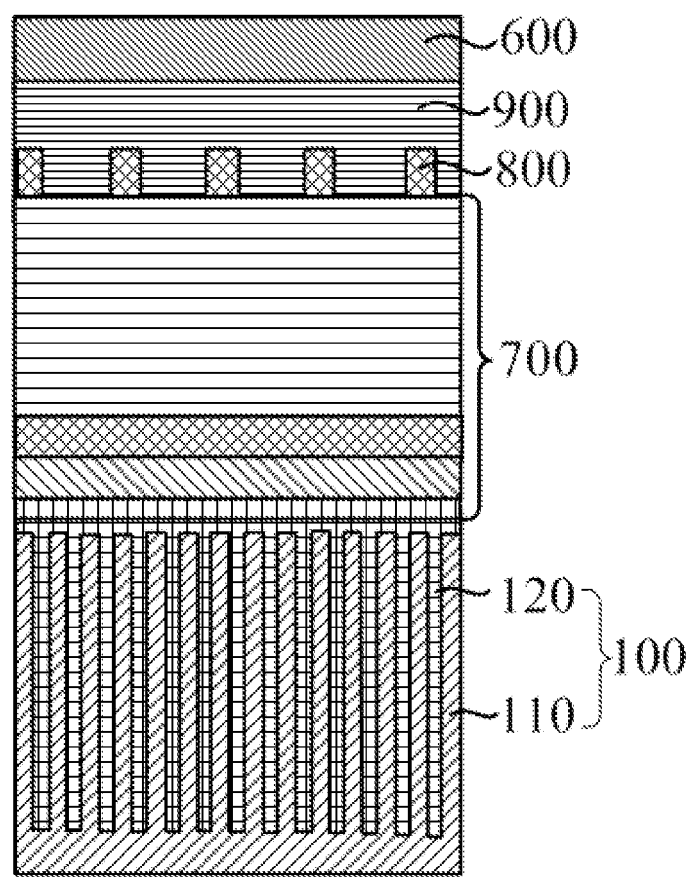
Figure 8:
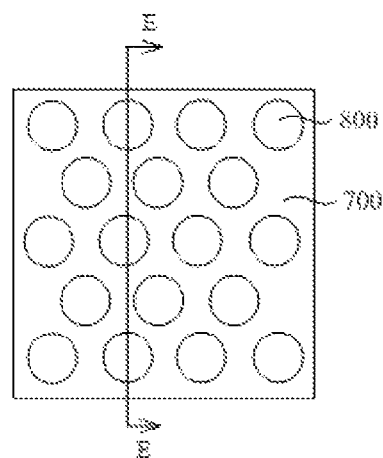
Figure 9:
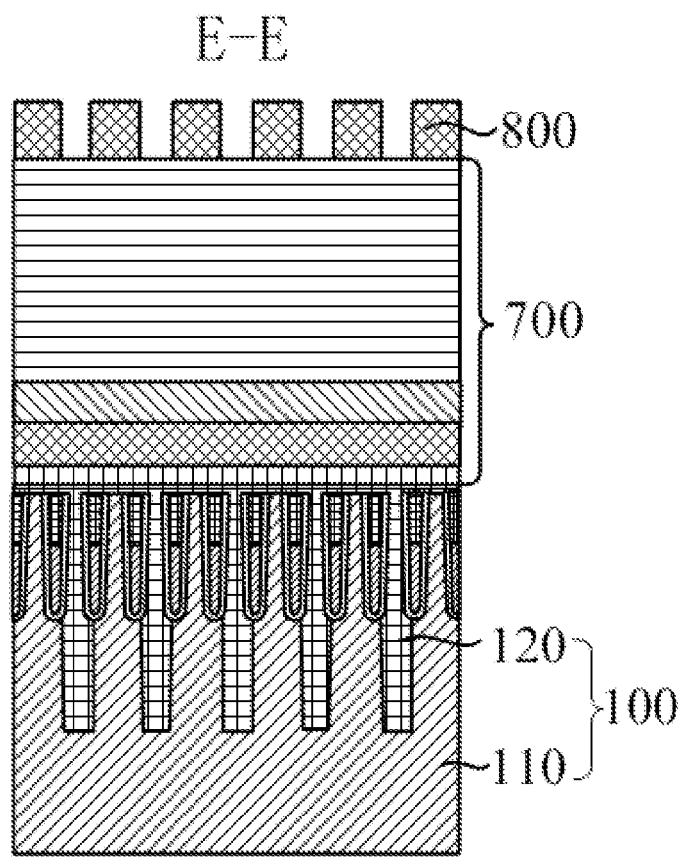
Figure 10:
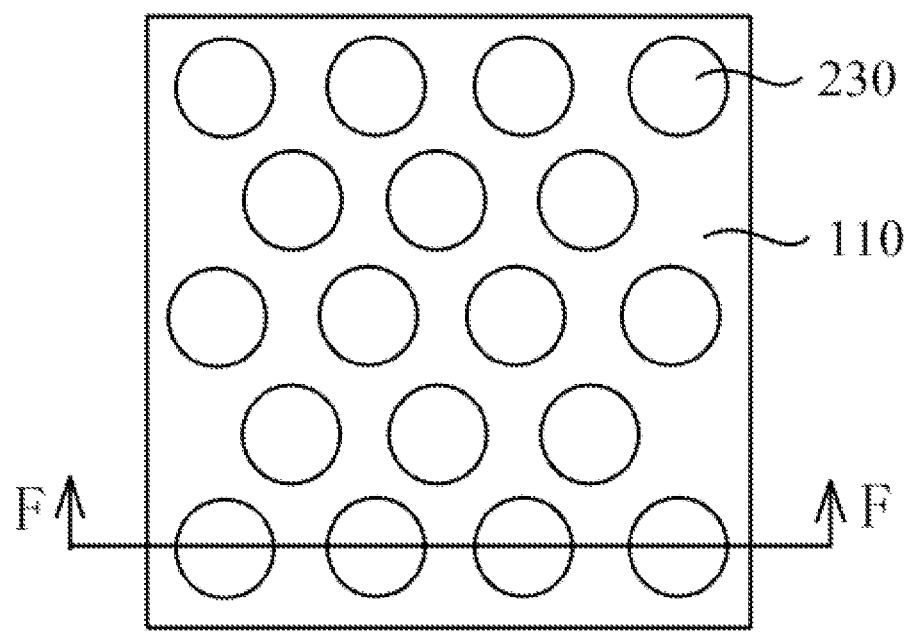
Figure 11:
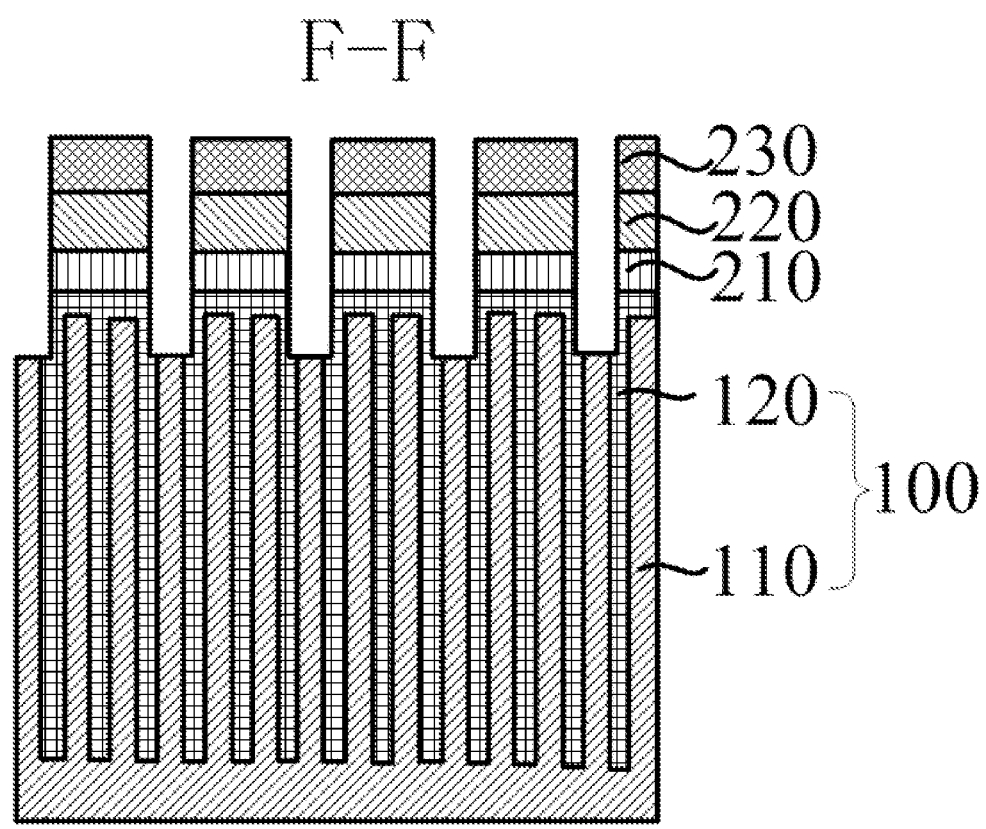
Figure 12:
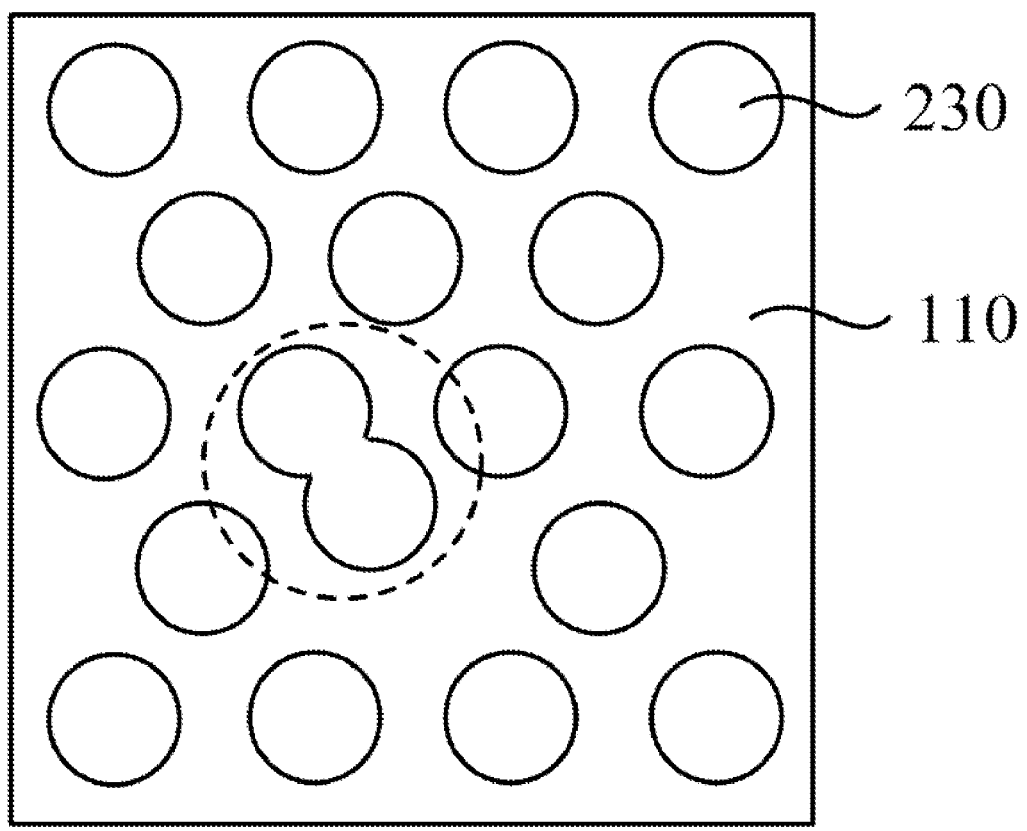
Figure 13:
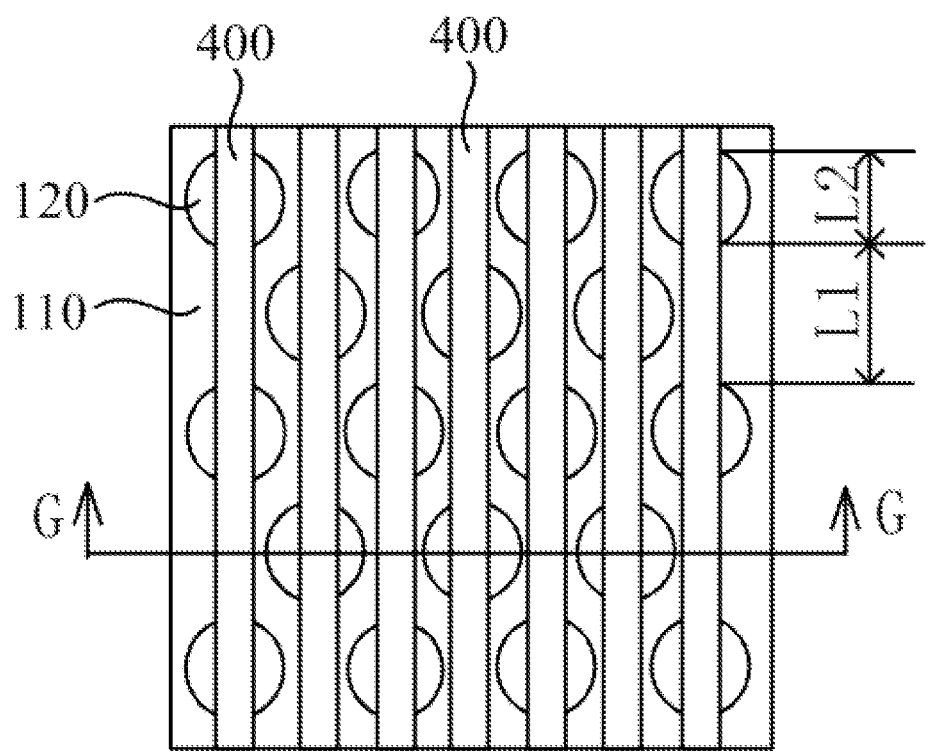
Figure 14:
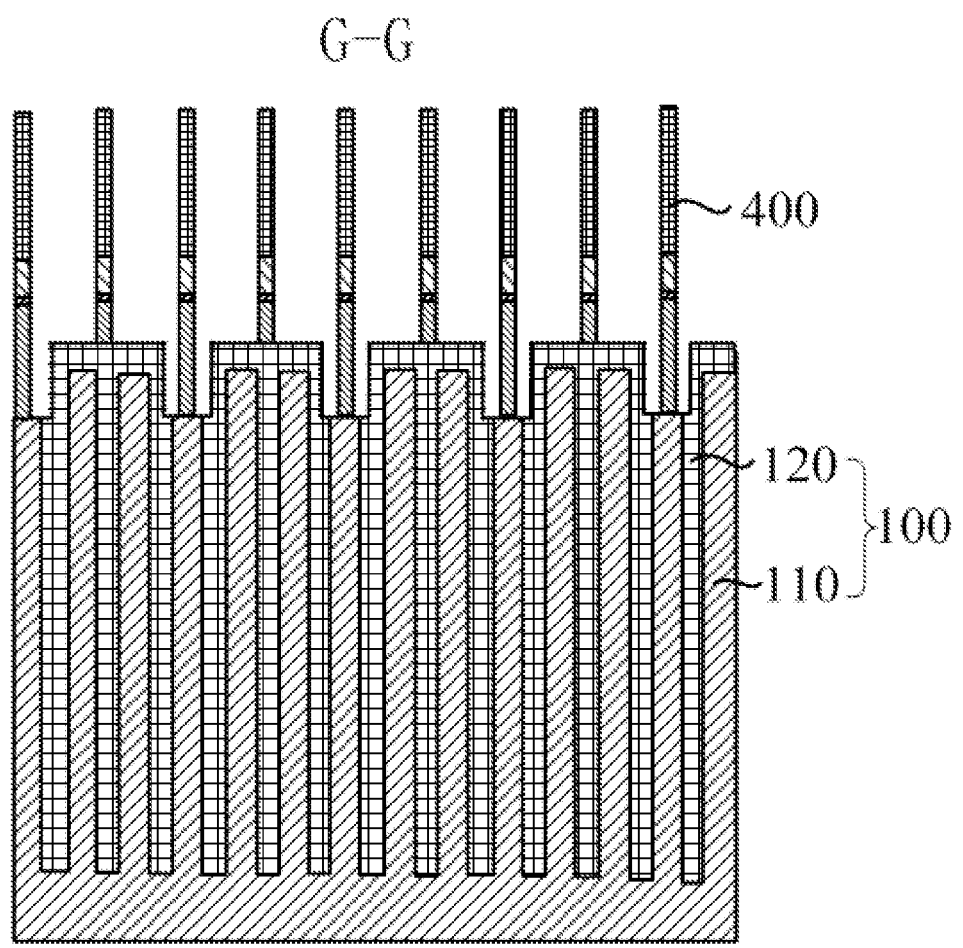
Figure 15:
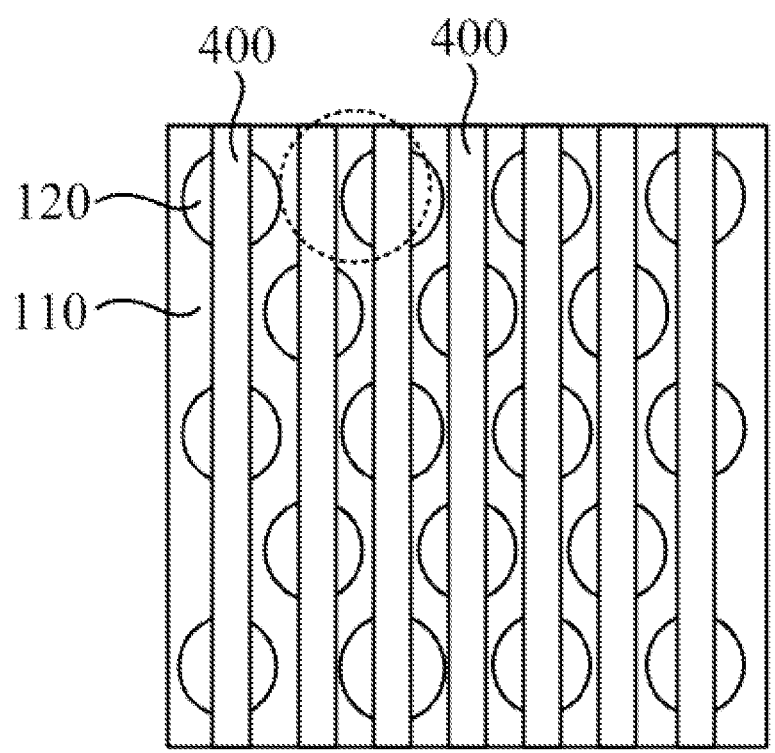
Figure 16:
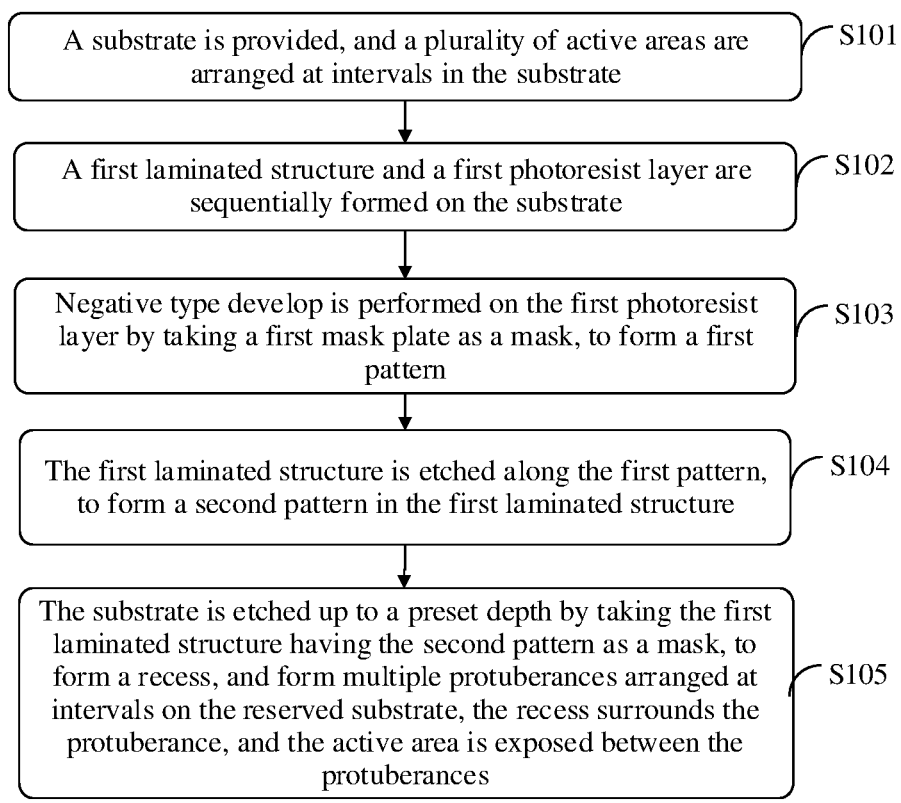
Figure 17:
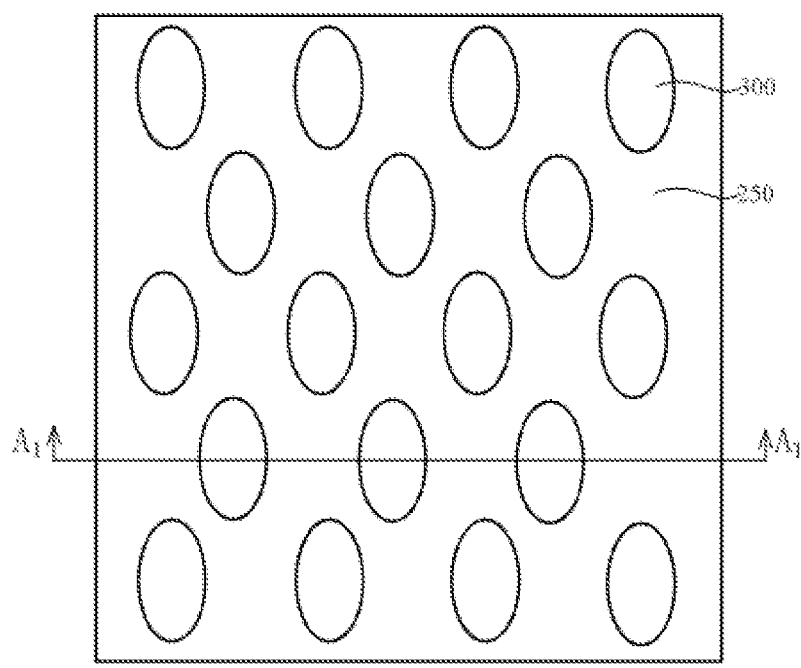
Figure 18:
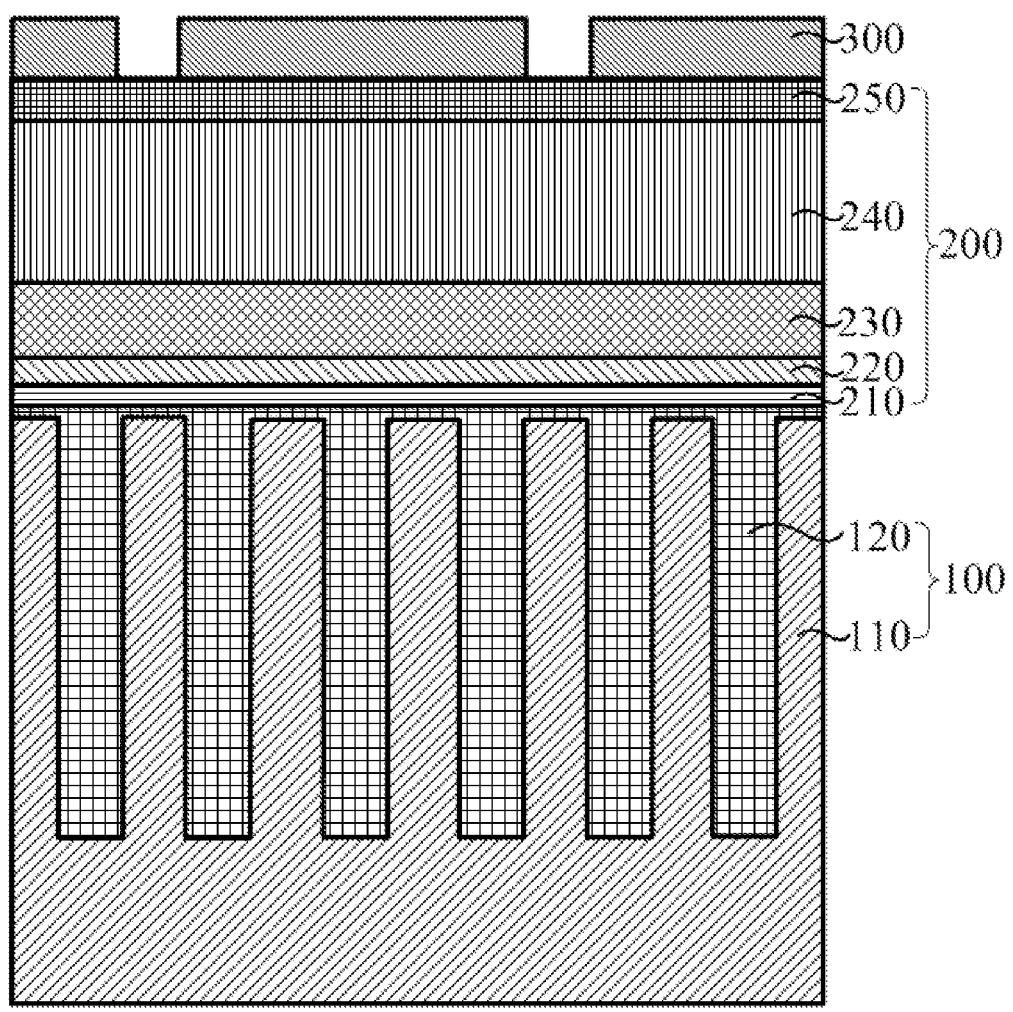
Figure 19:
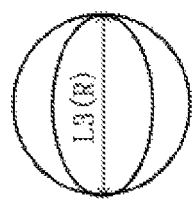
Figure 20:
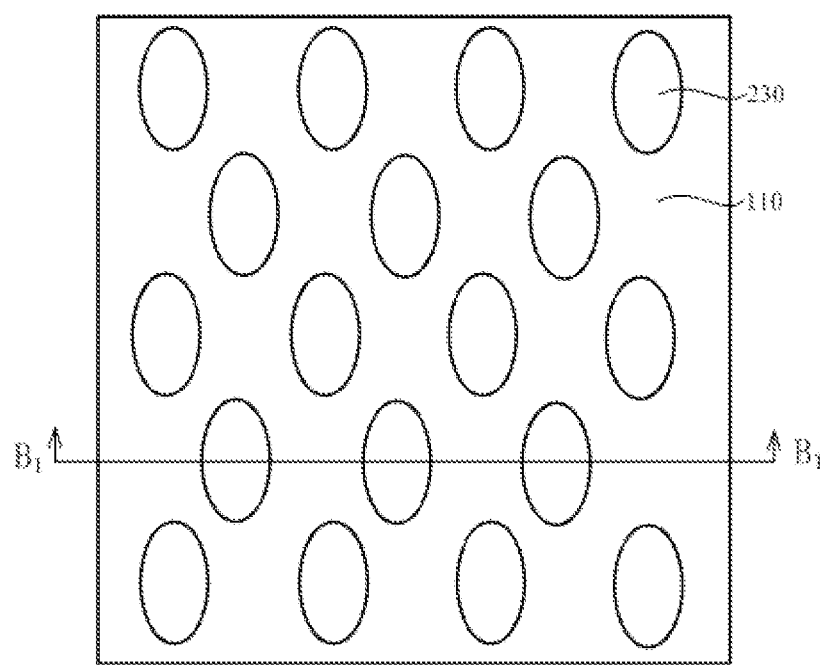
Figure 21:
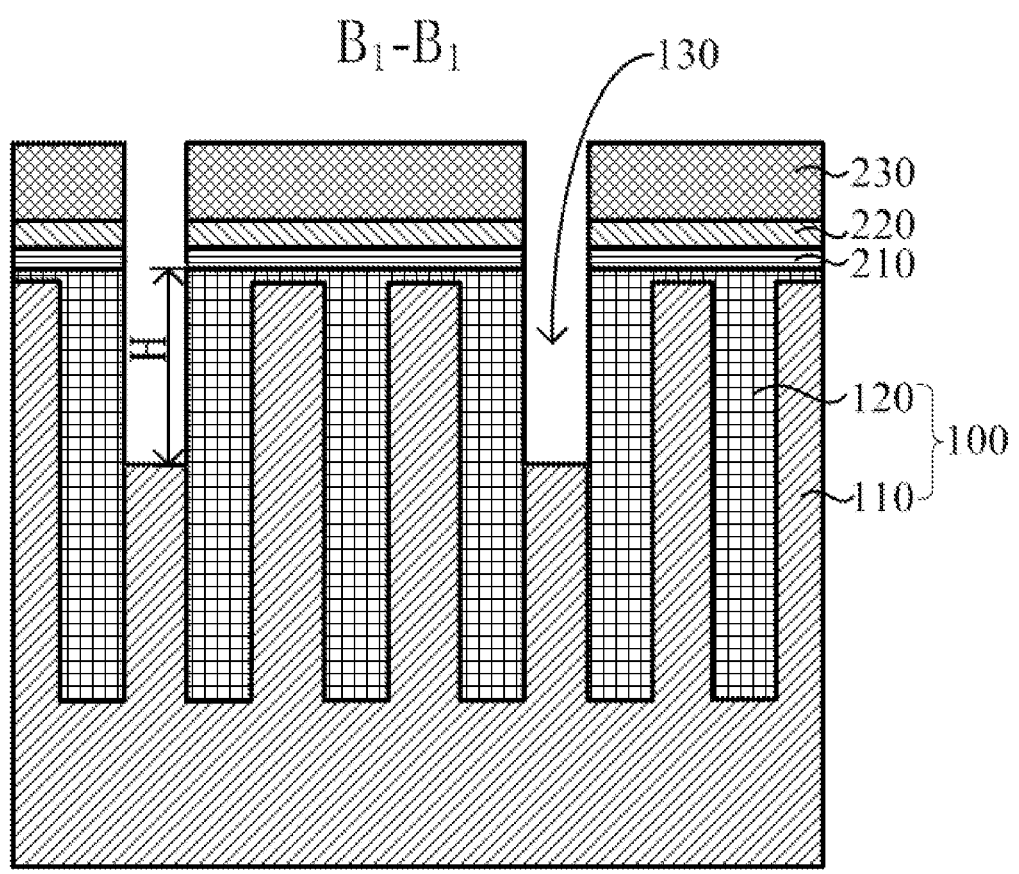
Figure 22:
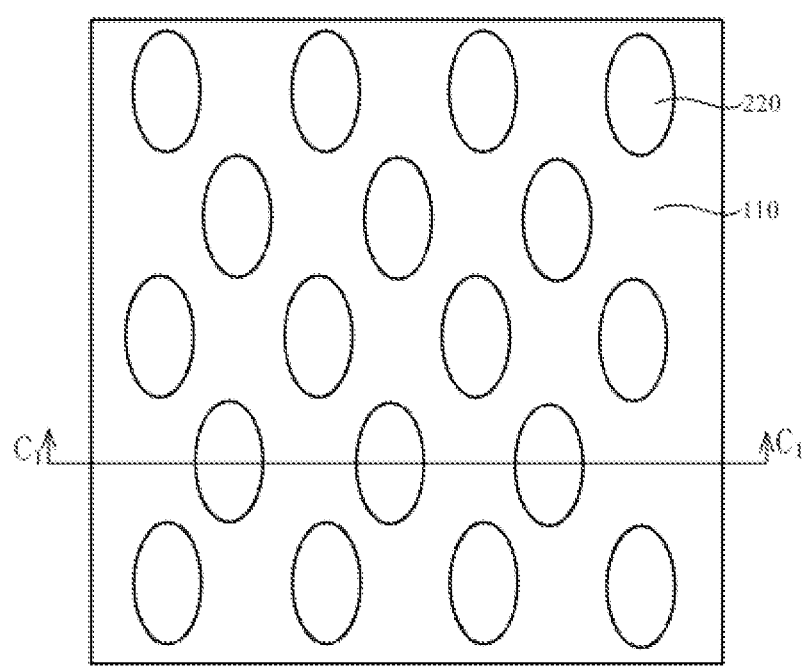
Figure 23:
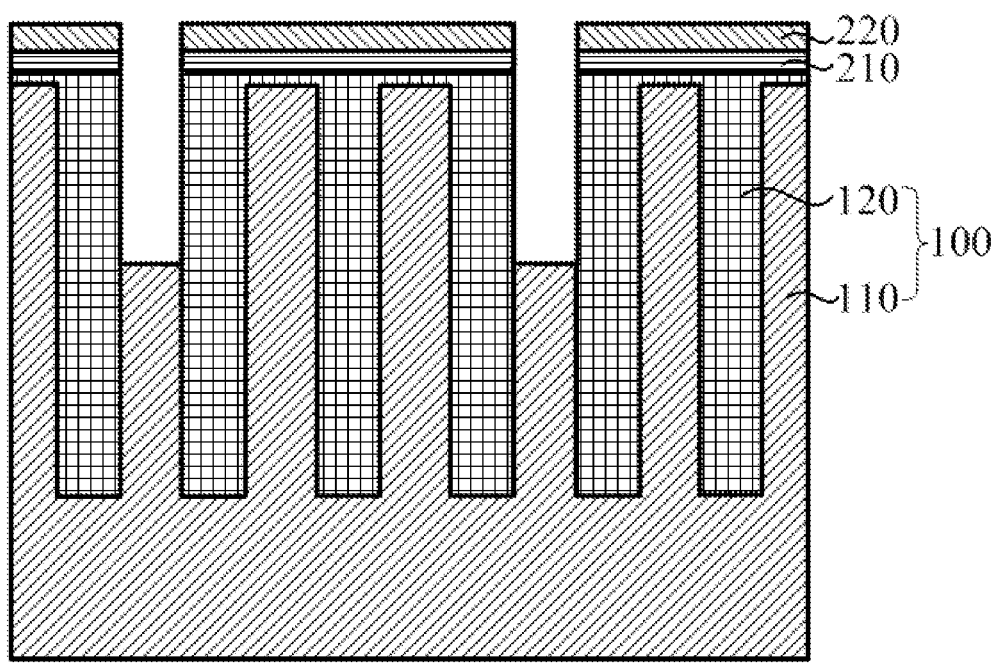
Figure 24:
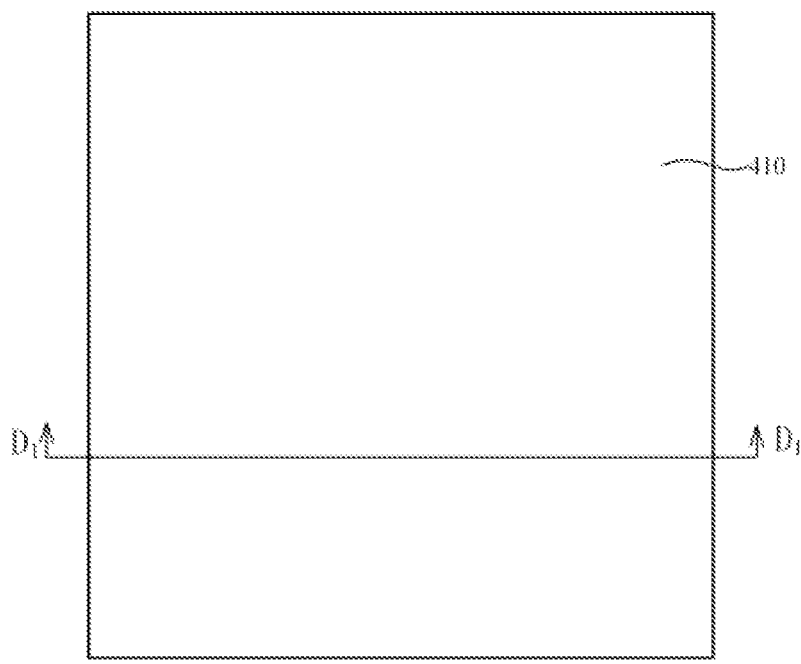
Figure 25:
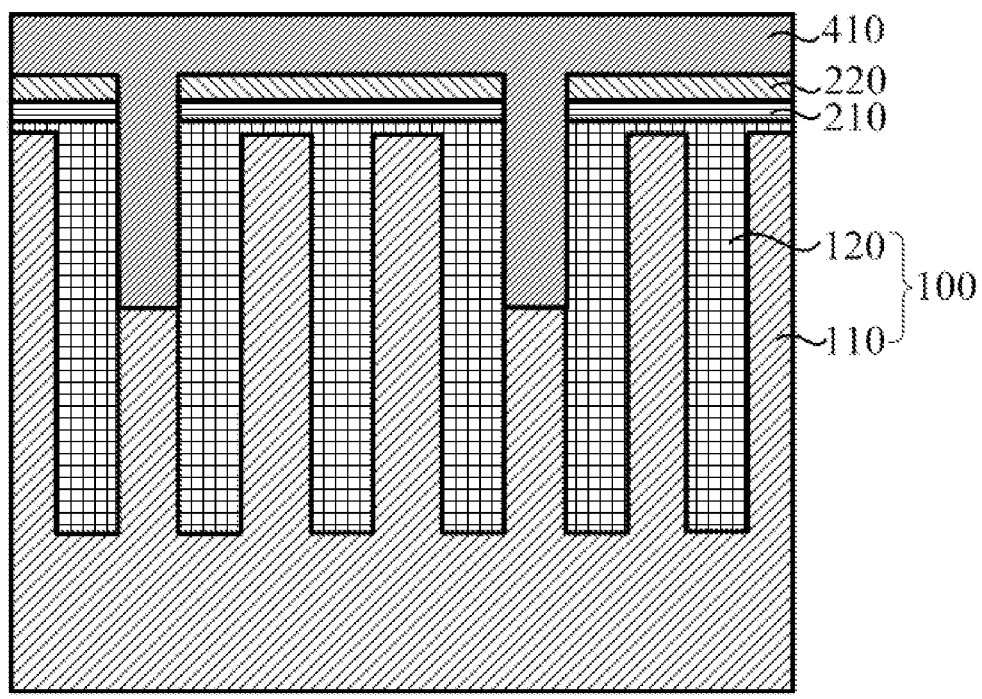
Figure 26:
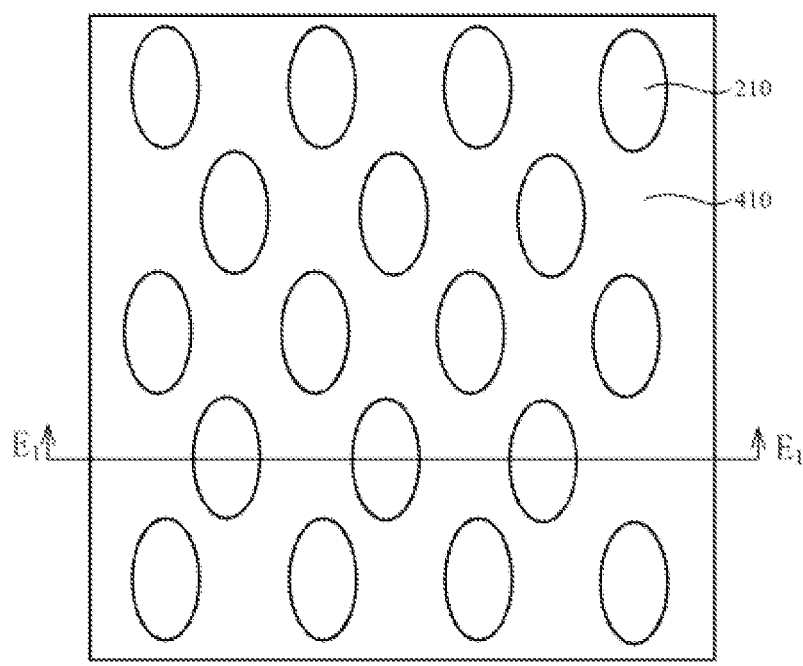
Figure 27:
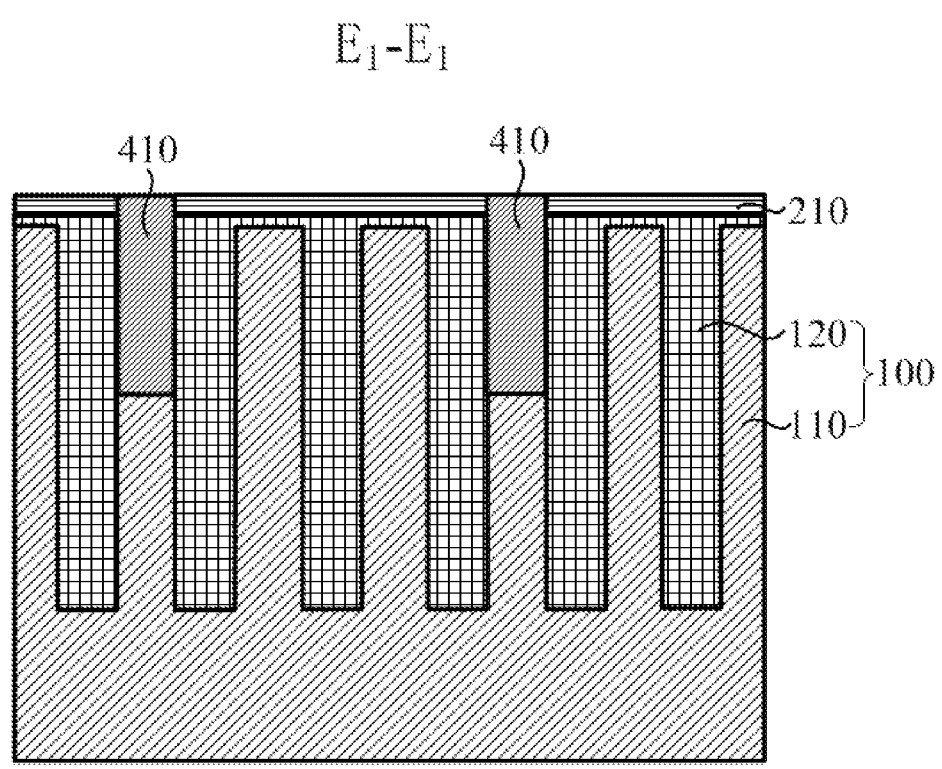
Figure 28:
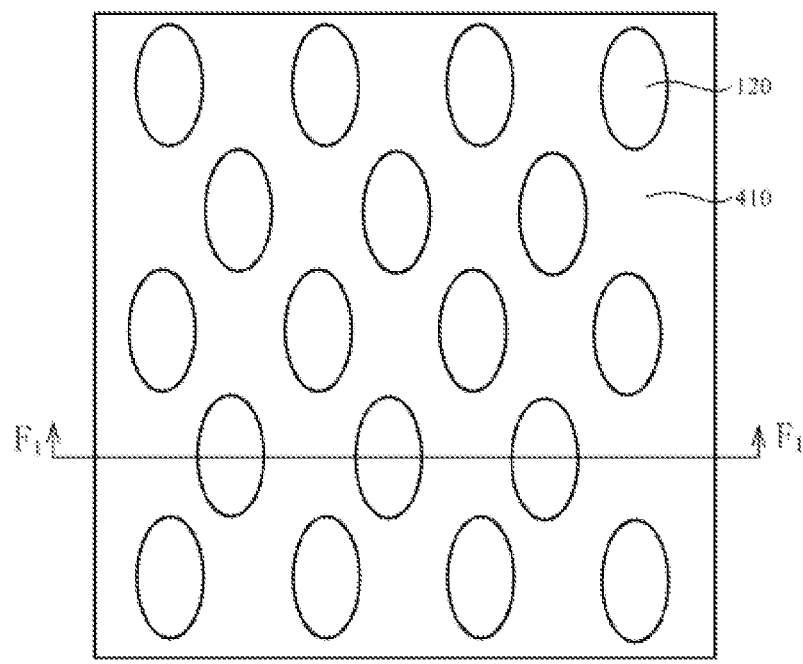
Figure 29:
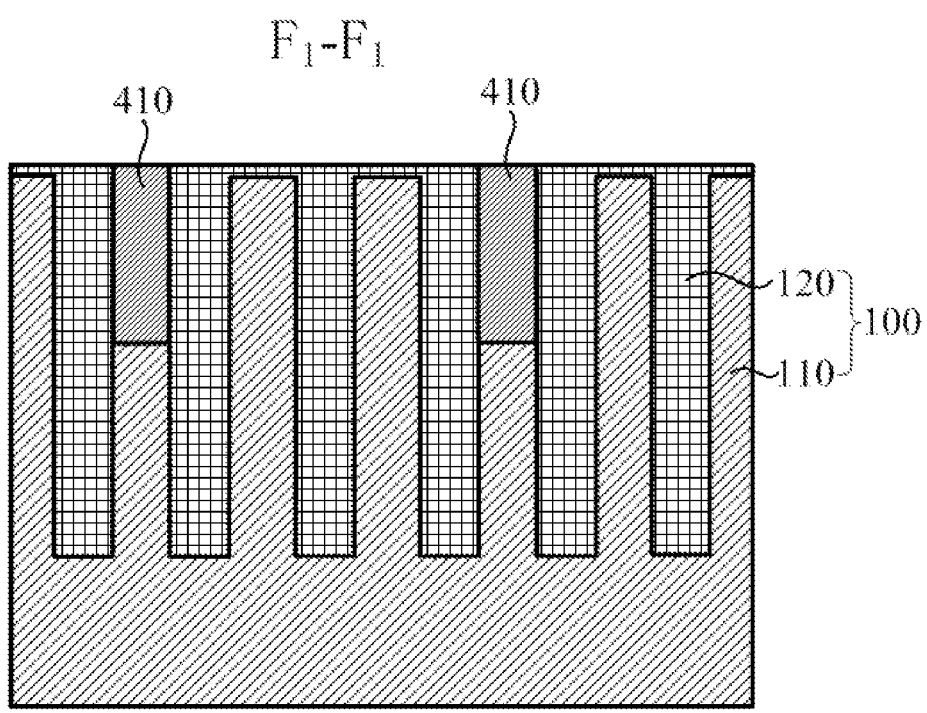
Figure 30:
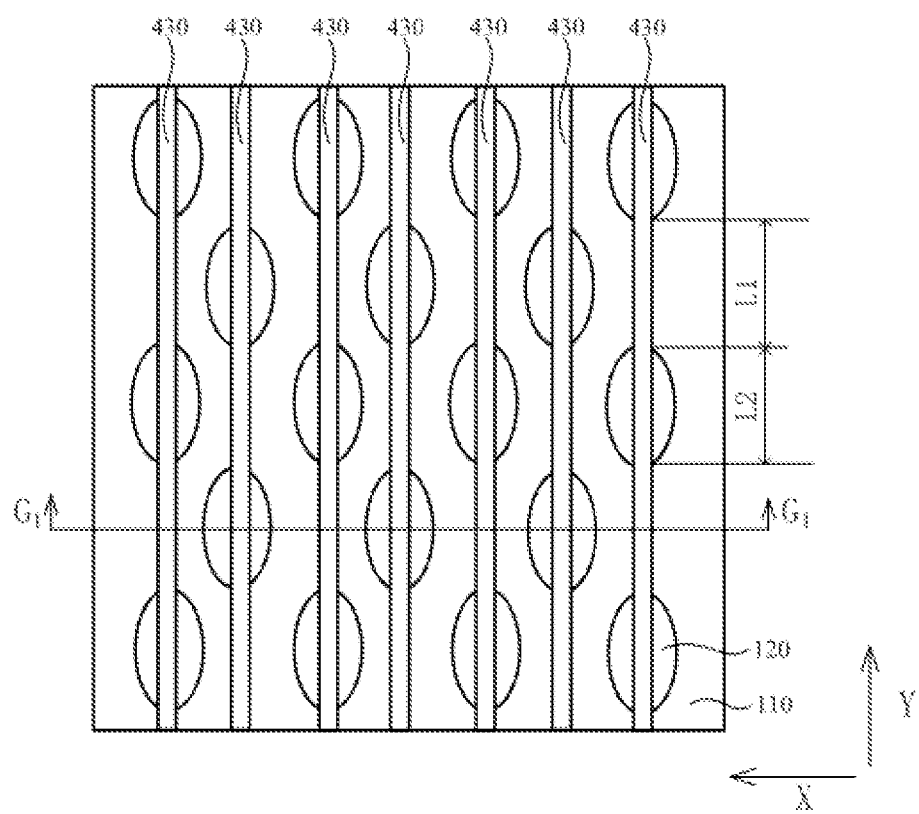
Figure 31:
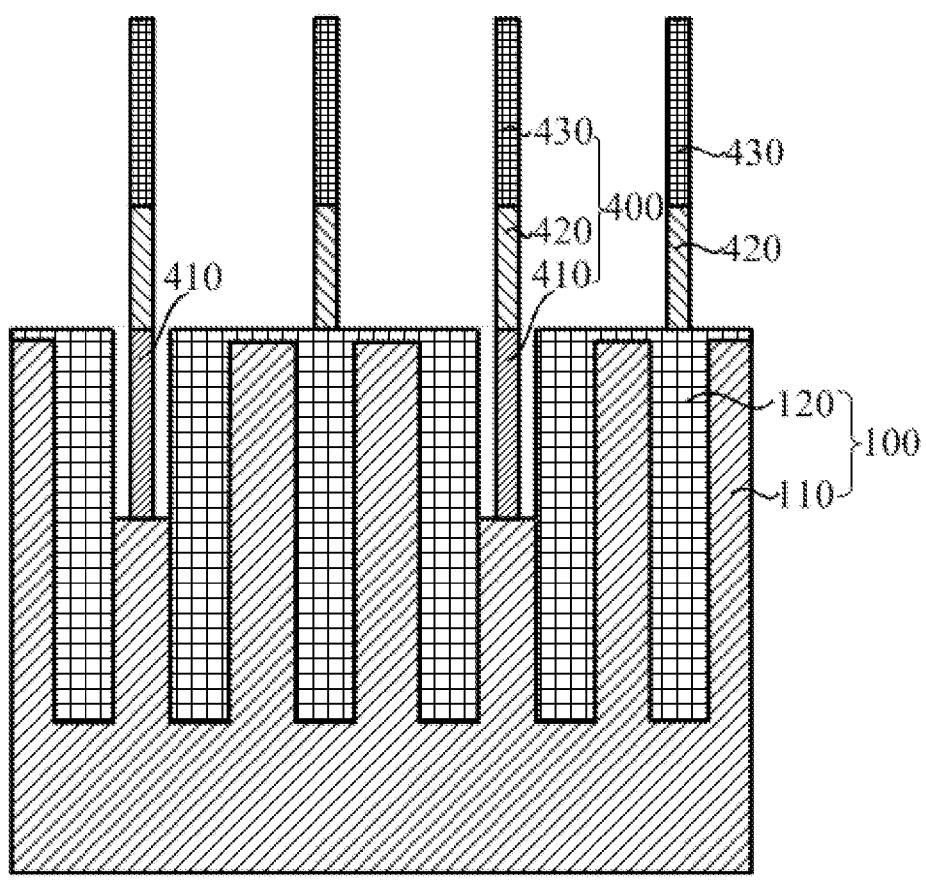
Figure 32:
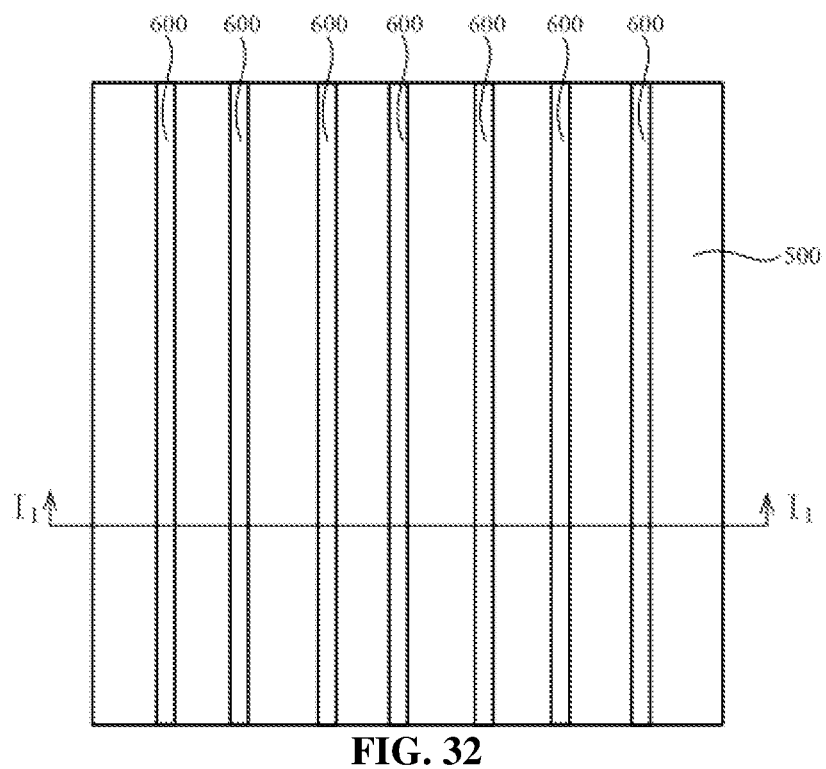
Figure 33:
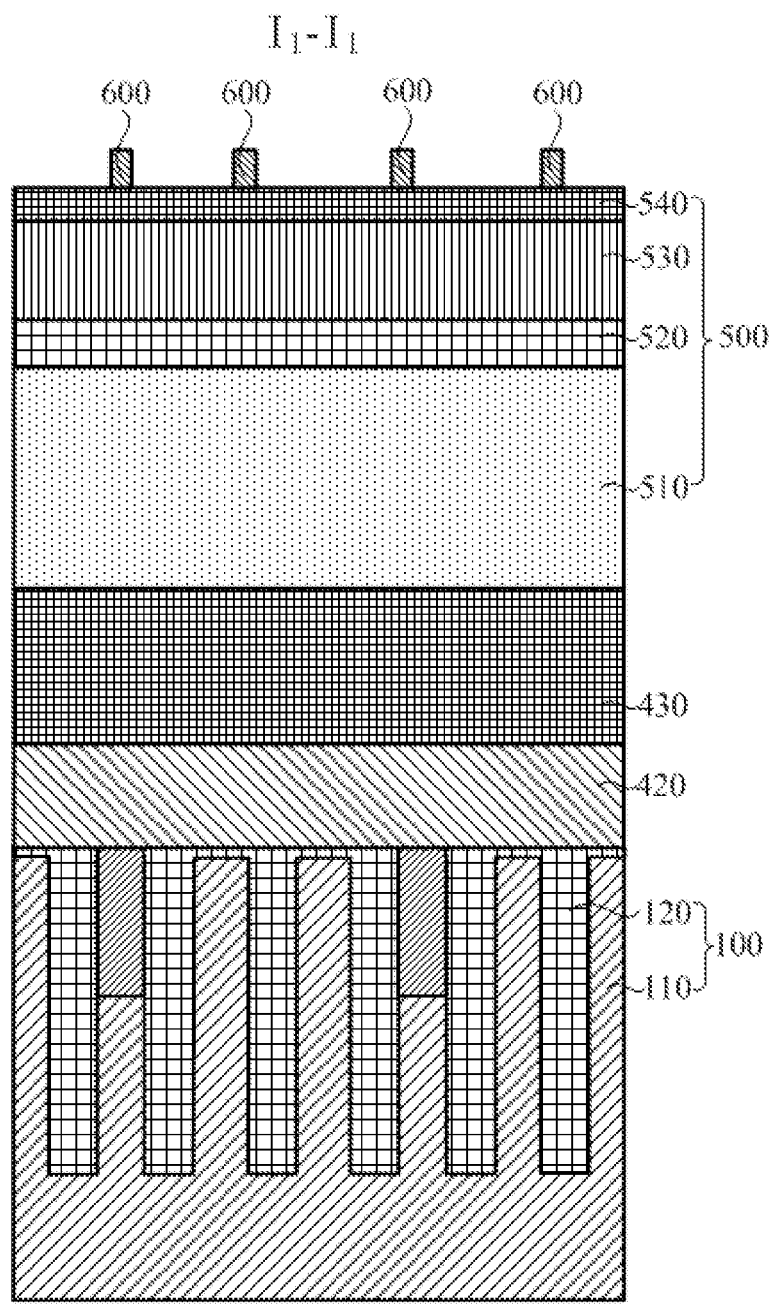

FIG. 2 is a sectional view at A-A in FIG. 1.
FIG. 3 is a top view after a sixth pattern is formed in an intermediate layer in a related technology.
FIG. 4 is a sectional view at B-B in FIG. 3.
FIG. 5 is a top view after a second photoresist layer is formed in a related technology.
FIG. 6 is a sectional view at C-C in FIG. 5.
FIG. 7 is a sectional view at D-D in FIG. 5.
FIG. 8 is a top view after an eighth pattern is formed in an intermediate layer in a related technology.
FIG. 9 is a sectional view at E-E in FIG. 8.
FIG. 10 is a top view after a bit line contact area is formed in a related technology.
FIG. 11 is a sectional view at F-F in FIG. 10.
FIG. 12 is a schematic diagram of bridging of protuberances in a related art.
FIG. 13 is a top view after a bit line is formed in a related technology.
FIG. 14 is a sectional view at G-G in FIG. 13.
FIG. 15 is a schematic diagram after a bit line damage protuberance is formed in a related technology.
FIG. 16 is a flowchart of a method for manufacturing a semiconductor structure according to an embodiment of the disclosure.
FIG. 17 is a top view after a first photoresist layer is formed according to an embodiment of the disclosure.
FIG. 18 is a sectional view at $A_i$-$A_i$ in FIG. 17.
FIG. 19 is a pattern of a first mask plate according to an embodiment of the disclosure.
FIG. 20 is a top view after a substrate is etched up to a preset depth according to an embodiment of the disclosure.
FIG. 21 is a sectional view at $B_1$-$B_1$ in FIG. 20.
FIG. 22 is a top view after a hard mask layer is removed according to an embodiment of the disclosure.
FIG. 23 is a sectional view at $C_1$-$C_1$ in FIG. 22.
FIG. 24 is a top view after a second conductive layer is formed according to an embodiment of the disclosure.
FIG. 25 is a sectional view at $D_1$-$D_1$ in FIG. 24.
FIG. 26 is a top view after a first conductive layer and a part of a second conductive layer are formed according to an embodiment of the disclosure.
FIG. 27 is a sectional view at $E_1$-$E_1$ in FIG. 26.
FIG. 28 is a top view after an insulating layer and a part of a second conductive layer are removed according to an embodiment of the disclosure.
FIG. 29 is a sectional view at $F_1$-$F_1$ in FIG. 28.
FIG. 30 is a top view after a bit line is formed according to an embodiment of the disclosure.
FIG. 31 is a sectional view at $G_1$-$G_1$ in FIG. 30.
FIG. 32 is a top view after a second photoresist layer is formed according to an embodiment of the application.
FIG. 33 is a sectional view at $I_i$-$I_i$ in FIG. 32.

DETAILED DESCRIPTION

In a related technology, referring to FIG. 1 to FIG. 15, a semiconductor structure may be manufactured by the following operations. A substrate is provided. As shown in FIG. 2, the substrate 100 may include multiple active areas 110 arranged at intervals. Referring to FIG. 1 and FIG. 2, a third laminated structure 700, an intermediate layer 800, a fourth laminated structure 900 and a first photoresist layer 300 are sequentially formed on the substrate 100. The first photoresist layer 300 is provided with a fifth pattern. Referring to FIG. 3 and FIG. 4, the fourth laminated structure 900 and the intermediate layer 800 are etched by taking the first photoresist layer 300 as a mask, to form a sixth pattern in the intermediate layer 800. Referring to FIG. 5 and FIG. 7, the fourth laminated structure 900 is backfilled on the intermediate layer 800, and a second photoresist layer 600 is formed on the fourth laminated structure 900, the second photoresist layer 600 is provided with a seventh pattern. Referring to FIG. 8 and FIG. 9, the fourth laminated structure 900 and the intermediate layer 800 are etched by taking the second photoresist layer 600 as a mask, to form an eighth pattern. The eighth pattern is not coincided with the sixth pattern. Referring to FIG. 10 and FIG. 11, the third laminated structure 700 and the substrate 100 are etched by taking the intermediate layer 800 as a mask, and a bit line contact area is formed on the substrate 100, and the active area 110 is exposed in the bit line contact area.

It can be understood that, a part of the substrate 100 is etched to expose the active area 110, and an area which is not etched in the substrate 100 is reserved, to form a plurality of protuberances arranged at intervals. However, in the above manufacturing process, the eighth pattern is subject to coincide with the sixth pattern, which results in bridging of patterns on the intermediate layer 800, and the reserved third laminated structure 700 generates bridging as shown in a dotted line of FIG. 12, thereby reducing stability of the semiconductor structure and performance of a semiconductor device.

Referring to FIG. 13 and FIG. 14, a bit line 400 is formed on the substrate 100, and the bit line 400 passes through the protuberance and the active area 110. A part of the bit line 400 is located on the protuberance reserved on the substrate 100, as an area L2 shown in FIG. 13, and this part of bit line 400 is a penetration bit line. A part of the bit line 400 is located on the active area 110 of the substrate 100, as an area L1 shown in FIG. 13, this part of bit line 400 is an own bit line. However, in a process of forming the bit line 400, the protuberance near the bit line 400 is subject to be damaged, as an area shown in a dotted line of FIG. 15, which reduces stability of the semiconductor structure and performance of the semiconductor device.

In order to improve the stability of the semiconductor structure and the performance of the semiconductor device, the embodiments of the disclosure provide a method for manufacturing a semiconductor structure, which may include operations as follows. A first laminated structure and a first photoresist layer are sequentially formed on a substrate. Negative type develop is performed on the first photoresist layer by taking a first mask plate as a mask, to form a first pattern. The first laminated structure is etched along the first pattern, to form a second pattern in the first laminated structure. The substrate is etched up to a preset depth by taking the first laminated structure having the second pattern as a mask, to form a recess, and form multiple protuberances arranged at intervals on the reserved substrate. The recess surrounds the protuberance, and the active area is exposed between the protuberances. Negative type develop is performed on the first photoresist layer only once, and the first laminated structure is etched only once to form a required pattern, thereby avoiding an alignment problem caused by double development and etching, and thus improving stability of the semiconductor structure and performance of the semiconductor device.

In order to make the above objectives, features and advantages of the embodiments of the disclosure apparent and understandable, the technical solutions in the embodiments of the disclosure are clearly and completely described below in combination with the drawings in the embodiments of the disclosure. It is apparent that the described embodiments are only a part rather than all of the embodiments of the disclosure. On the basis of the embodiments of the disclosure, all other embodiments obtained by those of ordinary skilled in the art without creative work shall fall within the scope of protection of the disclosure.

Referring to FIG. 16, a method for manufacturing a semiconductor structure in the embodiments of the disclosure may include the following operations S101 to S105.

At S101, a substrate is provided. Multiple active areas are arranged at intervals in the substrate.

Referring to FIG. 17 and FIG. 18, the active area 110 is arranged in the substrate 100. As shown in FIG. 18, the active area 110 is unexposed to a surface of the substrate 100. The number of active areas 110 may be multiple and multiple active areas 110 are arranged at intervals.

Exemplarily, a Shallow Trench Isolation (STI) structure is arranged among the multiple active areas 110, and silicon oxide ($SiO_2$) is provided in the STI structure 120, to isolate the multiple active areas 110 from each other. The material of the active area 110 may include silicon (Si).

It should be illustrated that the substrate 100 may be a Si substrate, and the substrate may also be a germanium (Ge) substrate, a Silicon On Insulator (SOI) substrate, a silicon germanium (SiGe) substrate, a silicon carbide (SiC) substrate or a gallium nitride (GaN) substrate and the like.

At S102, a first laminated structure and a first photoresist layer are sequentially formed on the substrate.

Continuously referring to FIG. 17 and FIG. 18, the first laminated structure 200 is formed on the substrate 100, the first laminated structure 200 covers the active area 110 of the substrate 100. The first photoresist layer 300 is formed on the first laminated structure 200. The first photoresist layer 300 covers the first laminated structure 200.

In a possible example, an insulating layer 210, a first conductive layer 220, a hard mask layer 230, a first mask layer 240 and a first antireflective layer 250 are sequentially formed on the substrate 100. The insulating layer 210 is configured to isolate the active area 110 in the substrate 100, and protect the active area 110, and the material of the insulating layer 210 may include one or more of silicon nitride, silicon oxide and silicon oxynitride. The material of the first conductive layer 220 may include polycrystalline silicon, the material of the hard mask layer 230 may include one or more of silicon oxide, titanium nitride or silicon nitride, the material of the first mask layer 240 may include Spin on Hardmask (SOH), and the material of the first antireflective layer may include silicon oxynitride.

After the first antireflective layer 250 is formed, the first photoresist layer 300 is formed on the first antireflective layer 250. The first photoresist layer 300 may be a phenol-formaldehyde polymer, a chemical structure of the photoresist may be changed by light, and an exposed part of the photoresist or an unexposed part of the photoresist may be removed through a chemical solvent.

At S103, negative type develop is performed on the first photoresist layer by taking a first mask plate as a mask, to form a first pattern.

Continuously referring to FIG. 17 and FIG. 18, the first mask plate (not shown in FIG. 17 and FIG. 18) is formed on the first photoresist layer 300, and negative type develop (NTD) is performed on the first photoresist layer 300 by taking the first mask plate as the mask. Through NTD, the exposed part in the first photoresist layer 300 is reserved, and the unexposed part in the first photoresist layer 300 is removed.

Exemplarily, in an NTD process, the exposure time may range from 10 s to 15 s, the NTD time may range from 50 s to 80 s, and negative type develop solution may be Tima90.

Through NTD, developing is performed on the first photoresist layer 300 to form a first pattern. The first pattern has relatively dense graphics. With the above arrangement, a subsequent manufacturing process of the first laminated structure 200 is reduced, and the efficiency of manufacturing the semiconductor structure is improved on one hand, an alignment problem of double development is avoided on the other hand, to avoiding bridging after the first laminated structure 200 is etched, thereby improving the stability of the semiconductor structure and the performance of the semiconductor device.

In some possible examples, patterns of the first mask plate may be multiple ovals arranged at intervals. Due to the above arrangement, the area of an orthographic projection of the protuberance on the substrate 100 is reduced, and the area of the bit line contact area is increased, and an adjacent protuberance is prevented from being etched when the bit line is formed subsequently.

It can be understood that, compared with a related technology that patterns of the first mask plate are multiple circles arranged at intervals, in the embodiment of the disclosure, when the first photoresist layer 300, the first laminated structure 200 and the substrate 100 are etched subsequently, the first photoresist layer 300 forms an oval cylinder, the first laminated structure 200 forms an oval cylinder, and an oval protuberance is formed on the substrate 100.

As shown in FIG. 19, when a long axis L3 of the oval is equal to a radius R of the circle to ensure that the active areas 110 are separated from each other, the area of the oval is less than the area of the circle. Therefore, the distance between two adjacent ovals is increased, and the possibility of damage to the adjacent protuberance is reduced.

At S104, the first laminated structure is etched along the first pattern, to form a second pattern in the first laminated structure.

Continuously referring to FIG. 17 and FIG. 18, in a possible example, the first antireflective layer 250, the first mask layer 240, the hard mask layer 230, the insulating layer 210 and the first conductive layer 220 are etched along the first pattern. It can be understood that the method may also include removing the first photoresist layer 300 after etching the first laminated structure 200 along the first pattern.

At S105, the substrate is etched up to a preset depth by taking the first laminated structure having the second pattern as a mask, to form a recess, and form multiple protuberances arranged at intervals on the reserved substrate. The recess surrounds the protuberance, and the active area is exposed between the protuberances.

Referring to FIG. 20 and FIG. 21, the substrate 100 is etched up to a preset depth (H as shown in FIG. 21) by taking the first laminated structure 200 having the second pattern as the mask. As shown in FIG. 20 and FIG. 21, an upper part of the substrate 100 is etched to form a required pattern, and a lower part of the substrate 100 is not etched. That is, the lower part of the substrate 100 is reserved.

In a possible example, the preset depth may range from one fifth to one third of the thickness of the substrate 100. That is, the recess 130 is formed in the substrate 100, the depth of the recess 130 ranges from one fifth to one third of the thickness of the substrate 100, and the multiple protuberances are arranged at intervals on the reserved substrate 100.

It can be understood that, in an upper area of the substrate 100 as shown in FIG. 21, an area removed by etching forms the recess 130, an area of the substrate 100 which is not etched forms the protuberance. The recess 130 is arranged to surround the protuberance, and the active area 110 is exposed between the protuberances, that is, a part of the bottom of the recess 130 is the active area 110. Furthermore, the protuberance may be a bit line contact, and the bit line is connected with a transistor through the bit line contact.

In the same row of protuberances as shown in FIG. 20, the active area 110 is exposed between the adjacent protuberances. The two adjacent active areas 110 are separated by the protuberance. For example, the protuberance covers a part of the area at two ends of the active area 110.

The method for manufacturing the semiconductor structure provided by the embodiments of the disclosure may include the following operations. The substrate 100 provided with the multiple active areas arranged at intervals is provided. The first laminated structure 200 and the first photoresist layer 300 are sequentially formed on the substrate 100. Negative type develop is performed on the first photoresist layer 300 by taking a first mask plate as a mask, to form a first pattern. The first laminated structure 200 is etched along the first pattern, to form a second pattern in the first laminated structure 200. The substrate 100 is etched up to a preset depth by taking the first laminated structure 200 having the second pattern as a mask, to form a recess 130 and form multiple protuberances arranged at intervals on the reserved substrate. The recess 130 surrounds the protuberance, and the active area 110 is exposed between the protuberances. Compared with a related technology that two photoresist layers are formed, developing is performed on each photoresist layer, and an intermediate layer 800 is etched twice to form a required pattern, in the embodiments of the disclosure, negative type develop is performed on the first photoresist layer 300 only once, and the first laminated structure 200 is etched only once to form a required pattern, thereby avoiding an alignment problem caused by double development and etching, and thus improving stability of the semiconductor structure and performance of the semiconductor device. Moreover, it is not required to backfill the first laminated structure, thereby reducing a manufacturing process, and further decreasing the number of layers in the first laminated structure 200, and thus reducing the complexity of the first laminated structure 200. A required pattern is transferred to the substrate 100 through the first laminated structure 200, thereby reducing the possibility of bridging between the protuberances, and further improving the stability of the semiconductor structure and the performance of the semiconductor device.

It can be understood that, referring to FIG. 22 and FIG. 31, the method may further include the following operations after the substrate is etched up to the preset depth by taking the first laminated structure having the second pattern as the mask to form the recess.

Referring to FIG. 22 and FIG. 23, the first antireflective layer 250, the first mask layer 240 and the hard mask layer 230 are removed to expose the first conductive layer 220. As shown in FIG. 22 and FIG. 23, the insulating layer 210 and the first conductive layer 220 are sequentially reserved on the substrate 100, and the insulating layer 210 covers the protuberance of the substrate 100.

Referring to FIG. 24 and FIG. 25, after the first antireflective layer 250, the first mask layer 240 and the hard mask layer 230 are removed, the recess 130 is filled with a second conductive layer 410, and the second conductive layer 410 covers the first conductive layer 220.

As shown in FIG. 24 and FIG. 25, a conductive material is deposited within the recess 130 and on the first conductive layer 220, to form the second conductive layer 410. That is, the second conductive layer 410 fully fills the recess 130, covers the substrate 100, and covers the first conductive layer 220. As shown in FIG. 25, an upper surface of the second conductive layer 410 is flattened. The material of the second conductive layer 410 may be the same as the material of the first conductive layer 220. For example, both the second conductive layer 410 and the first conductive layer 220 are polycrystalline silicon.

Referring to FIG. 26 and FIG. 27, after the second conductive layer 410 is formed, a part of the second conductive layer 410 and the whole first conductive layer 220 on the insulating layer 210 are removed, and the reserved second conductive layer 410 is flush with the insulating layer 210. As shown in FIG. 26 and FIG. 27, a part of the second conductive layer 410 and the whole first conductive layer 220 departing from the substrate 100 are removed, to expose the insulating layer 210. The upper surface of the insulating layer 210 is flush with the upper surface of the second conductive layer 410, so that the upper surface of the semiconductor structure as shown in FIG. 27 is flat, which facilitates forming other layers on the surface.

As a part of the second conductive layer 410 and the whole first conductive layer 220 are removed, there is no second conductive layer 410 between a second bit line structure (a penetrating bit line) in the bit line 400 subsequently formed and the substrate 100. That is, there is no second conductive layer 410 between the second bit line structure and the protuberance. Also, the thickness of the second conductive layer 410 between a first bit line structure (the own bit line) in the bit line 400 subsequently formed and the substrate 100 is also be reduced.

With the above arrangement, a capacitive contact is formed between the bit lines 400 in a subsequent process, and the capacitive contact is usually made of a conductive material to be electrically connected to a capacitor. The insulating layer is arranged between the bit line 400 and the capacitive contact to perform electric isolation. Therefore, the bit line 400, the insulating layer and the capacitive contact may form a parasitic capacitance. In the embodiments of the disclosure, as a part of the second conductive layer 410 is removed, the polar plate area of the parasitic capacitance is reduced, thereby reducing the parasitic capacitance, improving the signal stability of the bit line 400, so that the semiconductor structure has better electrical parameters.

After a part of the second conductive layer 410 and the whole first conductive layer 220 on the insulating layer 210 are removed, a third conductive layer and a protection layer are sequentially formed on the insulating layer 210 and the reserved second conductive layer 410. The material of the third conductive layer may include one or more of tungsten, titanium, aluminum, nickel, titanium oxide or titanium nitride, and the material of the protection layer may include silicon nitride.

As the third conductive layer and the protection layer are formed after the part of the second conductive layer 410 is removed, in a condition that the third conductive layer and the protection layer are constant in thickness, the height between the upper surface of the protection layer and the upper surface of the substrate 100 is reduced, which reduces the height of the bit line 400 subsequently formed, and thus facilitates the stability of the bit line 400.

It is to be noted that, in a possible example, referring to FIG. 28 and FIG. 29, After the part of the second conductive layer 410 and the whole first conductive layer 220 on the insulating layer 210 are removed, the insulating layer 210 and a part of the second conductive layer 410 are also removed, so that the reserved second conductive layer 410 is flush with the substrate 100.

As shown in FIG. 28 and FIG. 29, after a part of the second conductive layer 410 and the whole first conductive layer 220 on the insulating layer 210 are removed, the insulating layer 210 and a part of the second conductive layer 410 may also be removed, to expose the substrate 100. The reserved second conductive layer 410 is flush with the substrate 100. After the insulating layer 210 and a part of the second conductive layer 410 are removed, the third conductive layer 420 and the protection layer 430 are sequentially formed on the substrate 100 and the second conductive layer 410.

Continuously referring to FIG. 30 and FIG. 31, after the third conductive layer 420 and the protection layer 430 are formed, a part of the protection layer 430, a part of the third conductive layer 420 and a part of the reserved second conductive layer 410 are removed, to form multiple bit lines 400 arranged at intervals. Each of the bit lines 400 extends along a first direction and passes through the active area and the protuberance. The multiple bit lines 400 are arranged along a second direction, and the second direction is vertical to the first direction.

As shown in FIG. 30 and FIG. 31, a part of the protection layer 430, a part of the third conductive layer 420 and a part of the reserved second conductive layer 410 are removed, and the reserved protection layer 430, the reserved third conductive layer 420 and the reserved second conductive layer 410 form the bit line 400. As shown in FIG. 30, each bit line 400 passes through the active area 110 and the protuberance in a vertical direction (Y direction as shown in FIG. 30).

Each bit line 400 extends along the first direction, and the multiple bit lines 400 are arranged along the second direction. Referring to FIG. 30, each bit line 400 extends along the vertical direction, such as the Y direction as shown in FIG. 30, and the multiple bit lines 400 are arranged at intervals along the horizontal direction, such as the X direction as shown in FIG. 30.

The bit line 400 may include multiple first bit line structures and multiple second bit line structures, and the first bit line structure and the second bit line structure are alternately arranged along the first direction. The first bit line structure is located on the active area 110. As shown in FIG. 30, the first bit line structure is located at L1, and the first bit line structure is an own bit line and passes through the active area 110. The second bit line structure is located on the protuberance, as shown in FIG. 30. The second bit line structure is located at L2, and the second bit line structure is a penetrating bit line and passes through the protuberance.

The height of the bit line 400 may range from 90 to 100 nm, compared with a related technology in which the height of the bit line 400 ranges from 130 to 140 nm, the height of the bit line 400 in the embodiments of the disclosure is reduced, thereby improving the stability of the bit line 400.

It is to be noted that, referring to FIG. 32 and FIG. 33, the step of removing a part of the protection layer 430, a part of the third conductive layer 420 and a part of the reserved second conductive layer 410 to form multiple bit lines 400 arranged at intervals may include the following operations.

Referring to FIG. 32 and FIG. 33, a second laminated structure 500 is formed on the protection layer 430. In a possible example, the step of forming the second laminated structure 500 on the protection layer 430 may include forming a filling layer 510, a second antireflective layer 520, a second mask layer 530 and a third antireflective layer 540 on the protection layer 430 in sequence. Herein, the material of the filling layer 510 may include amorphous carbon, the material of the second antireflective layer 520 and the third antireflective layer 540 may include silicon oxynitride, and the material of the second mask layer 530 may include SOH.

Continuously referring to FIG. 32 and FIG. 33, after the second laminated structure 500 is formed, a second photoresist layer 600 is formed on the second laminated structure 500, and positive developing is performed on the second photoresist layer 600 by taking a second mask plate as a mask, to form a third pattern. As shown in FIG. 32, patterns of the second mask plate may be multiple rectangles arranged in parallel. The pattern of the second mask plate corresponds to the active area 110 and the protuberance.

After the third pattern is formed, the second laminated structure 500 is etched along the third pattern, to form a fourth pattern in the second laminated structure 500. The pattern on the second mask plate is transferred onto the second laminated structure 500 through the second photoresist layer 600.

After the fourth pattern is formed, the protection layer 430, the third conductive layer 420 and the second conductive layer 410 are etched by taking the second laminated structure 500 having the fourth pattern as a mask, and the reserved protection layer 430, the reserved third conductive layer 420 and the reserved second conductive layer 410 form the bit line 400. On one hand, the bit line 400 is relatively low, and thus has good stability. On the other hand, the second conductive layer 410 below the bit line 400 is removed, which reduces the parasitic capacitance of the bit line 400. It is to be noted that, as shown in FIG. 30 and FIG. 31, the reserved second laminated structure 500 is removed after the bit line 400 is formed.

The embodiments of the disclosure further provide a semiconductor structure. As shown in FIG. 30 and FIG. 31, the semiconductor structure may include a bit line 400, the bit line 400 is formed according to the method for manufacturing the semiconductor structure in the above embodiment, and the formed bit line 400 passes through the protuberance and the active area 110 of the substrate 100, thereby reducing the possibility of bridging between the protuberances, and improving the stability of the semiconductor structure and the performance of the semiconductor device.

The height of the formed bit line 400 is relatively low. For example, the height of the bit line 400 ranges from 90 to 100 nm. Therefore the bit line 400 has better stability. Moreover, there is no second conductive layer 410 between the second bit line structure in the bit line 400 subsequently formed and the substrate 100, that is, there is no second conductive layer 410 between the second bit line structure and the protuberance, and the thickness of the second conductive layer 410 between the first bit line structure in the bit line 400 subsequently formed and the substrate 100 may also be reduced.

With the above arrangement, in a subsequent process, a capacitive contact is formed between the bit lines 400, and the capacitive contact is a conductive material, to be electrically connected to a capacitor. The insulating layer is arranged between the bit line 400 and the capacitive contact to perform electric isolation. Therefore, the bit line 400, the insulating layer and the capacitive contact may form parasitic capacitance. In the embodiments of the disclosure, as a part of the second conductive layer 410 is removed, the polar plate area of the parasitic capacitance is reduced, thereby reducing the parasitic capacitance, improving the signal stability of the bit line 400, so that the semiconductor structure has better electrical parameters.

Various embodiments or implementation in the specification are described in a progressive way, each of the embodiments focuses on the difference from other embodiments, and regarding same and similar parts among various embodiments, reference may be made to each other.

In description of the specification, description of referring terms such as "one embodiment", "some embodiments", "a schematic embodiment", "example", "a specific example", or "some examples" refers to that specific features, structures, materials or features described in combination with the embodiments or examples are involved in at least one embodiment or example of the disclosure. In the specification, schematic description on the above terms does not always refer to same embodiment or example. Moreover, the described specific features, structures, materials or features may be combined in any one or more embodiments or examples in a proper manner.

Finally, it is to be noted that the above various embodiments are used to illustrate the technical solutions of the disclosure, rather than limiting the technical solution. Although the disclosure has been described in detail with reference to the foregoing various embodiments, those of ordinary skill in the art should understand that the technical solutions described in the foregoing various embodiments may also be modified, or a part or all technical features of the technical solutions are equivalently replaced, but the modifications and replacements do not make the essence of the corresponding technical solutions depart from the scope of the technical solutions of various embodiments of the disclosure.

The invention claimed is:

1. A method for manufacturing a semiconductor structure, comprising:
   providing a substrate in which a plurality of active areas are arranged at intervals;
   sequentially forming a first laminated structure and a first photoresist layer on the substrate;
   performing Negative Type Develop (NTD) on the first photoresist layer by taking a first mask plate as a mask, to form a first pattern;
   etching the first laminated structure along the first pattern, to form a second pattern in the first laminated structure; and
   etching the substrate up to a preset depth by taking the first laminated structure having the second pattern as a mask, to form a recess and form a plurality of protuberances arranged at intervals on a remaining portion of the substrate, wherein the recess surrounds the protuberances, and the active areas are exposed between the protuberances,
   wherein the sequentially forming the first laminated structure and the first photoresist layer on the substrate comprises:
      sequentially forming an insulating layer, a first conductive layer, a hard mask layer, a first mask layer and a first antireflective layer on the substrate; and
      forming the first photoresist layer on the first antireflective layer,
   wherein the method further comprises: after the etching the substrate up to the preset depth by taking the first laminated structure having the second pattern as the mask, to form the recess,
      removing the first antireflective layer, the first mask layer and the hard mask layer, to expose the first conductive layer;

filling the recess with a second conductive layer, the second conductive layer covering the first conductive layer;
removing a part of the second conductive layer and all of the first conductive layer on the insulating layer, to enable a remaining portion of the second conductive layer to be flush with the insulating layer;
sequentially forming a third conductive layer and a protection layer on the insulating layer and the remaining portion of the second conductive layer; and
removing a part of the protection layer, a part of the third conductive layer and a part of the remaining portion of the second conductive layer, to form a plurality of bit lines arranged at intervals, wherein each of the bit lines extends along a first direction and passes through the active areas and the protuberances, the bit lines are arranged along a second direction, and the second direction is vertical to the first direction.

2. The method for manufacturing the semiconductor structure according to claim 1, wherein the preset depth ranges from one fifth to one third of a thickness of the substrate.

3. The method for manufacturing the semiconductor structure according to claim 1, wherein a pattern of the first mask plate is a plurality of ovals arranged at intervals.

4. The method for manufacturing the semiconductor structure according to claim 1, wherein a material of the insulating layer comprises silicon nitride, a material of the first conductive layer comprises polycrystalline silicon, a material of the hard mask layer comprises silicon oxide, a material of the first mask layer comprises Spin on Hardmask (SOH), and a material of the first antireflective layer comprises silicon oxynitride.

5. The method for manufacturing the semiconductor structure according to claim 1, wherein each of the bit lines comprises a first bit line structure and a second bit line structure, the first bit line structure and the second bit line structure are alternately arranged, the first bit line structure is located on a corresponding one of the active areas, and the second bit line structure is located on a corresponding one of the protuberances.

6. The method for manufacturing the semiconductor structure according to claim 1, further comprising: after the removing the part of the second conductive layer and all of the first conductive layer on the insulating layer,
removing the insulating layer and a second part of the second conductive layer, to enable the remaining portion of the second conductive layer to be flush with the substrate.

7. The method for manufacturing the semiconductor structure according to claim 1, wherein a material of the third conductive layer comprises tungsten, and a material of the protection layer comprises silicon nitride.

8. The method for manufacturing the semiconductor structure according to claim 1, further comprising: before the removing the part of the protection layer, the part of the third conductive layer and the part the remaining portion of the second conductive layer to form the bit lines arranged at intervals,
forming a second laminated structure on the protection layer;
forming a second photoresist layer on the second laminated structure, and performing positive developing on the second photoresist layer by taking a second mask plate as a mask, to form a third pattern;
etching the second laminated structure along the third pattern, to form a fourth pattern in the second laminated structure; and
etching the protection layer, the third conductive layer and the second conductive layer by taking the second laminated structure having the fourth pattern as a mask, wherein a remaining portion of the protection layer, a remaining portion of the third conductive layer and the remaining portion of the second conductive layer forms the bit lines.

9. The method for manufacturing the semiconductor structure according to claim 8, wherein a height of each of the bit lines ranges from 90 to 100 nm.

10. The method for manufacturing the semiconductor structure according to claim 8, wherein patterns of the second mask plate are a plurality of rectangles arranged in parallel.

11. The method for manufacturing the semiconductor structure according to claim 8, wherein the forming the second laminated structure on the protection layer comprises:
sequentially forming a filling layer, a second antireflective layer, a second mask layer and a third antireflective layer on the protection layer.

12. The method for manufacturing the semiconductor structure according to claim 11, wherein a material of the filling layer comprises amorphous carbon, a material of the second antireflective layer and the third antireflective layer comprises silicon oxynitride, and a material of the second mask layer comprises Spin on Hardmask (SOH).

13. A semiconductor structure comprising a bit line formed by a method for manufacturing the semiconductor structure, wherein the method comprises:
providing a substrate in which a plurality of active areas are arranged at intervals;
sequentially forming a first laminated structure and a first photoresist layer on the substrate;
performing Negative Type Develop (NTD) on the first photoresist layer by taking a first mask plate as a mask, to form a first pattern;
etching the first laminated structure along the first pattern, to form a second pattern in the first laminated structure; and
etching the substrate up to a preset depth by taking the first laminated structure having the second pattern as a mask, to form a recess and form a plurality of protuberances arranged at intervals on a remaining portion of the substrate, wherein the recess surrounds the protuberances, and the active areas are exposed between the protuberances,
wherein the sequentially forming the first laminated structure and the first photoresist layer on the substrate comprises:
sequentially forming an insulating layer, a first conductive layer, a hard mask layer, a first mask layer and a first antireflective layer on the substrate; and
forming the first photoresist layer on the first antireflective layer,
wherein the method further comprises: after the etching the substrate up to the preset depth by taking the first laminated structure having the second pattern as the mask, to form the recess,
removing the first antireflective layer, the first mask layer and the hard mask layer, to expose the first conductive layer;

filling the recess with a second conductive layer, the second conductive layer covering the first conductive layer;

removing a part of the second conductive layer and all of the first conductive layer on the insulating layer, to enable a remaining portion of the second conductive layer to be flush with the insulating layer;

sequentially forming a third conductive layer and a protection layer on the insulating layer and the remaining portion of the second conductive layer; and removing a part of the protection layer, a part of the third conductive layer and a part of the remaining portion of the second conductive layer, to form a plurality of bit lines arranged at intervals, wherein each of the bit lines extends along a first direction and passes through the active areas and the protuberances, the bit lines are arranged along a second direction, and the second direction is vertical to the first direction.

14. The semiconductor structure according to claim 13, wherein the preset depth ranges from one fifth to one third of a thickness of the substrate.

15. The semiconductor structure according to claim 13, wherein a pattern of the first mask plate is a plurality of ovals arranged at intervals.

16. The semiconductor structure according to claim 13, wherein a material of the insulating layer comprises silicon nitride, a material of the first conductive layer comprises polycrystalline silicon, a material of the hard mask layer comprises silicon oxide, a material of the first mask layer comprises Spin on Hardmask (SOH), and a material of the first antireflective layer comprises silicon oxynitride.

* * * * *